United States Patent [19]
Konishi et al.

[11] Patent Number: 5,204,628
[45] Date of Patent: Apr. 20, 1993

[54] ELECTRON SPIN RESONANCE SYSTEM

[75] Inventors: Kenta Konishi; Akio Nakanishi; Nahoko Sugahara, all of Mishima, Japan

[73] Assignee: Sumitomo Special Metal Co., Ltd., Osaka, Japan

[21] Appl. No.: 909,709

[22] Filed: Jul. 7, 1992

Related U.S. Application Data

[63] Continuation of Ser. No. 555,593, Jul. 23, 1990, Pat. No. 5,142,232.

[30] Foreign Application Priority Data

Oct. 9, 1989 [JP] Japan .................. 1-263328

[51] Int. Cl.⁵ .............................................. G01R 33/20
[52] U.S. Cl. ...................................... 324/316; 324/318
[58] Field of Search .............. 324/300, 316, 318, 319, 324/320, 322

[56] References Cited

U.S. PATENT DOCUMENTS

| | | | |
|---|---|---|---|
| 4,399,406 | 8/1983 | Biehl et al. ........................... | 324/316 |
| 4,437,063 | 3/1984 | Biehl et al. ........................... | 324/316 |
| 4,446,429 | 5/1984 | Froncisz et al. ...................... | 324/316 |
| 4,724,389 | 2/1988 | Hyde et al. ........................... | 324/318 |
| 4,803,624 | 2/1989 | Pilbrow et al. ....................... | 324/316 |
| 5,142,232 | 8/1992 | Konishi et al. ....................... | 324/316 |

Primary Examiner—Michael J. Tokar
Attorney, Agent, or Firm—Watson, Cole, Grindle & Watson

[57] ABSTRACT

An electron spin resonance system comprising a magnetic circuit in which a pair of permanent magnets are respectively attached to opposing surfaces of a pair of stationary yokes arranged opposite to each other by way of a gap, a movable yoke is disposed to at least one of the pair of the stationary yokes for continuously changing the distance between opposing surfaces of the stationary yokes, so that the magnetic resistance of a magnetic path formed by the permanent magnets, stationary yokes and movable yokes is varied continuously thereby forming a continuously varying magnetic field in the gap between the opposed permanent magnets, and a modulating magnetic field application coil for applying a modulating magnetic field and/or a sweeping magnetic field application coil for applying a sweeping magnetic field to the gap, a cavity resonator disposed in the gap in which a specimen to be measured can be inserted, and a microwave generator and a microwave detector disposed to the cavity resonator.

37 Claims, 7 Drawing Sheets

ELECTRON SPIN RESONANCE SYSTEM

This application is a continuation of Ser. No. 555,593, filed Jul. 23, 1990, now U.S. Pat. No. 5,142,232, issued Aug. 25, 1992.

BACKGROUND OF THE INVENTION

1. Field of the Invention

The present invention concerns an electron spin resonance system using a permanent magnet magnetic circuit as a magnetic field generating device and, more particularly, it relates to an electron spin resonance system (hereinafter referred to as "ESR system") having a structure, which is micro-miniaturized by combining a permanent magnet magnetic circuit using a movable yoke for continuously varying a distance between yokes opposite to each other thereby continuously adjusting a magnetic field in a desired gap, and a microwave generator/receiver.

The ESR system is generally used for chemical analysis in the field of research and development.

Since the ESR system can detect unpaired electrons due to natural radiation damages of test objects and exactly measure the ages of archaelogical remains, minerals and fossil remains, it has also been utilized recently in the field of archaelogy and earth science.

The ESR system for such application uses comprises a magnetic field generating device and a microwave circuit device connected to it and it is necessary, for the magnetic field generating device forming an essential part of the ESR system, that it can form a magnetic field of such an intensity as determined depending on the physical property value of a test object, frequency of microwave, etc., at high accuracy and uniformity in a gap in which a test object is placed.

2. Description of the Prior Art

In the magnetic field generating device used for the ESR system, electromagnets have usually been employed. It is easy to generate a magnetic field in a desired gap and continuously change the intensity thereof by continuously varying a current applied to the electromagnets but this involves a drawback that the entire device weight of the system reaches as much as 1 to 2 ton and the system becomes expensive as well.

Further, the microwave circuit device also has a complicate structure to make the size larger and the cost more expensive.

Further, there has been proposed a structure using only permanent magnets as a magnetic field generating source so that the magnetic field intensity is changed by changing the opposing distance (length of the gap) between a pair of permanent magnets.

However, this structure also has a disadvantage that when the opposing distance is changed, the degree of uniformity of the magnetic field is impaired due to various causes such as deviation of the axis of one of the opposing permanent magnets from that of the other.

Usually, the degree of uniformity of the magnetic field required in the ESR system is as high as less than 0.01% and, accordingly, a device using a magnetic circuit comprising permanent magnets has no yet been put to practical use.

In view of the above, the present applicant has already proposed a constitution for a magnetic field generating device capable of continuously changing the intensity of the magnetic field in a desired gap without changing the opposing distance between permanent magnets, that is, a constitution in which a permanent magnet is disposed to each of opposing surfaces of a pair of stationary yokes disposed opposite to each other with a gap, a movable yoke is disposed to at least one of a pair of the stationary yokes for continuously varying the distance between the opposing surfaces of the stationary yokes, and the magnetic resistance of a magnetic path formed by the permanent magnets the stationary yokes and the movable yoke is continuously varied by the operation to the movable yoke thereby enabling to adjust the magnetic field intensity in the gap (refer to Japanese Utility Model Laid-Open Hei 1-104574).

The applicant has also proposed a magnetic circuit for generating a magnetic field of a constitution capable of varying the intensity of the magnetic field in a desired gap at a high accuracy, in which a movable yoke is disposed to each of a pair of stationary yokes described above such that the movable yokes are brought closer to or aparted from each other in symmetry with respect to the central traverse plane of the gap (refer to Japanese Patent Application Hei 1-154875).

With the same purpose, the applicant also has proposed a magnetic circuit for generating magnetic field, in which the movable yoke disposed to each of the stationary yokes comprises a plurality of members which are disposed, for example, coaxially and made movable individually, to attain finer adjustment for the intensity of the magnetic field (refer to Japanese Patent Application Hei 1-218233).

These proposals have enabled the employment of a magnetic circuit using permanent magnets as a magnetic field generating source for the ESR system.

However, for improving the practical usefulness of the ESR system, it is necessary, in addition to the improvement of the magnetic circuit described above, that the magnetic circuit is arranged effectively and that the entire ESR system including peripheral equipments, etc. for reading the value of a magnetic field causing magnetic resonance at high accuracy has to be reduced in the size and the weight.

SUMMARY OF THE INVENTION

Accordingly, it is an object of the present invention to provide an inexpensive ESR system with a reduced weight which has satisfactory degree of uniformity for the magnetic field intensity in the gap can vary the magnetic field intensity continuously and at high accuracy while maintaining a high degree of uniformity, and has a reduced weight of several kilograms and is less expensive as well.

Another object of the present invention is to provide an ESR system capable of reading the value of a magnetic field causing magnetic resonance at a high accuracy upon measurement and capable of directly observing and recording ESR absorption curves.

A further object of the present invention is to provide an ESR system which can be manufactured and maintained easily and is less expensive as compared with conventional ESR systems.

The ESR system according to the present invention uses, as a magnetic field generating device, a magnetic circuit in which a pair of permanent magnets are disposed, respectively, to a pair of stationary yokes arranged in opposite to each other by way of a gap, a magnetic pole piece is attached to the permanent magnet, a movable yoke is disposed to at least one of the pair of the stationary yokes for continuously changing the distance between the opposing surfaces of the stationary yokes, and the magnetic resistance of a magnetic path formed by the permanent magnets, the stationary yokes and the movable yoke is made continuously variable, so that continuously varying magnetic field is caused by generate in a gap between the opposing permanent magnets.

Further, a modulating magnetic field application coils for supplying an AC current for applying a modulating magnetic field into the gap and/or a sweeping magnetic field application coil for supplying a DC current for sweeping the magnetic field in the gap are disposed around the periphery of the magnetic pole piece or the permanent magnet or around the periphery of the movable yoke of the magnetic circuit.

Further, in this ESR system, a cavity resonator in which a test object can be inserted is disposed in the gap and a microwave generator and a microwave detector are attached to the cavity resonator.

DESCRIPTION OF THE PREFERRED EMBODIMENTS

In the present invention, the shape of the yokes to which permanent magnets are attached may be optional, for example, a square plate or the like depending on the shape of each of permanent magnets used, magnetic characteristics, etc.

For the permanent magnets serving as a magnetic field generating source, it is desired to select known material, shape, etc., for example, magnets of rare earth group or ferritic material, depending on the required magnetic field intensity, the size of the device, etc. In particular, remarkable reduction of size can be attained by using Fe-B-R series permanent magnets in which Fe and B are main ingredient and R means light rare earth elements such as Nd and Pr abound in resource, and showing a high energy product of more than 30 MHOe.

The magnetic pole pieces attached to the permanent magnets are effective to the improvement of the degree of uniformity of the magnetic field in the gap.

In particular, in a case of using a plurality of block-form permanent magnets in integration, they contribute to the moderation of the scattering in the magnetic properties of each of the block-form permanent magnets or enable to effectively concentrate the magnetic fluxes in the gap.

Although various known constitutions may be employed as the magnetic pole piece, it is particularly desirable to dispose an annular protrusion having a trapezoidal or rectangular cross section at the periphery of the disc-like magnetic pole piece.

Figure 2:
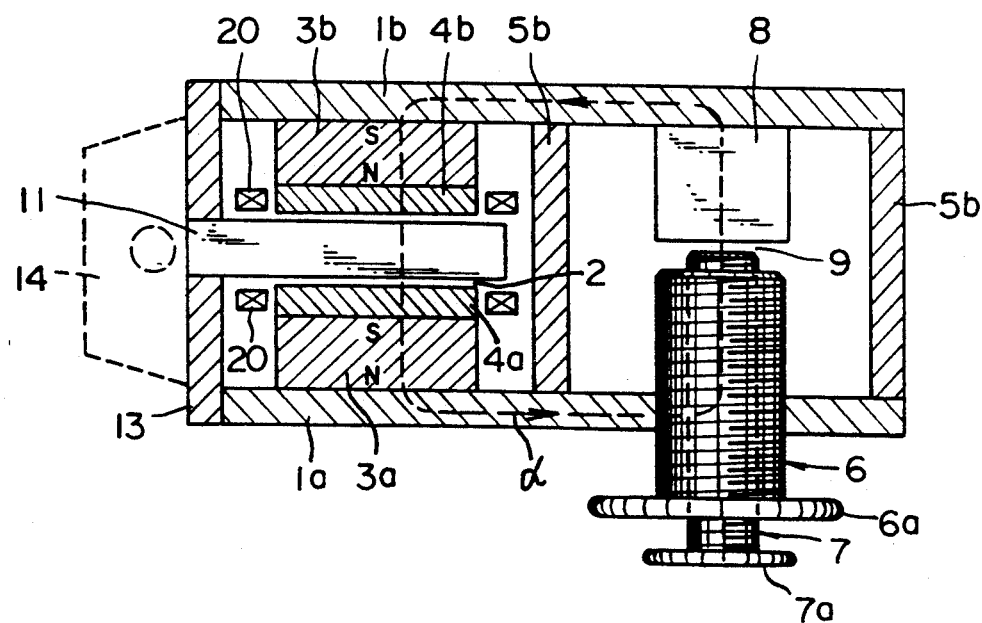
FIG. 2 is an explanatory vertical cross sectional view for one embodiment of a magnetic circuit used in the ESR system shown in FIG. 1.

The movable yoke, which is adapted to continuously change the magnetic resistance in the magnetic path, comprises, a coarsely movable screwed bolt of large diameter and a finely movable screwed of small diameter disposed coaxially as shown in, for example, FIG. 2, in which coarse adjustment for the magnetic field intensity is at first made by forwarding and backwarding the coarsely movable screwed bolt and then fine adjustment is made by forwarding and backwarding the finely movable screwed bolt, by which the change of the required gap Bg can be moderated.

Figure 7:
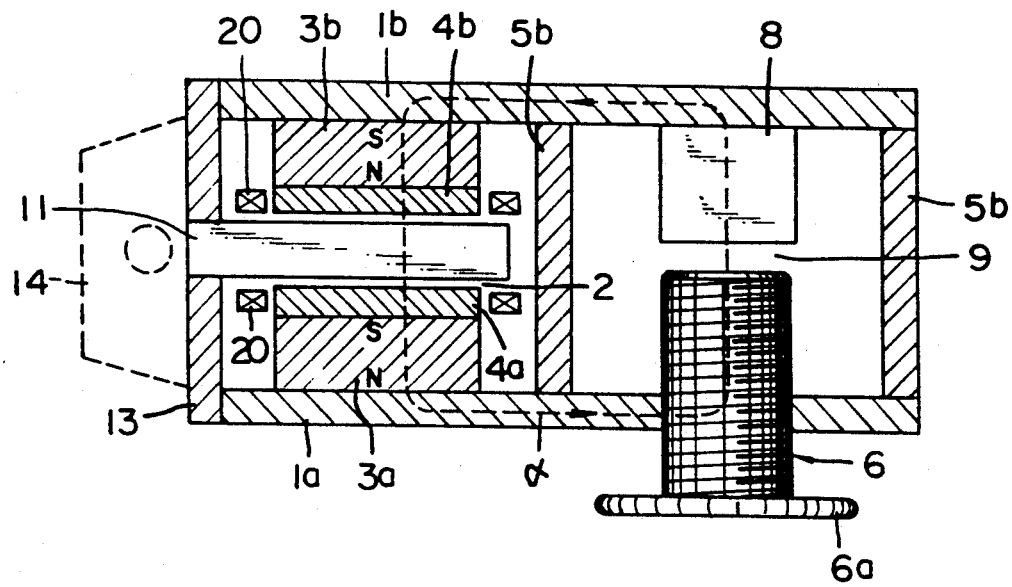

As shown in FIG. 7, the magnetic field can be adjusted at high accuracy even by means of a single screwed bolt by selecting the outer diameter, screw pitch, etc. of the screwed member, by which the purpose of the present invention can be attained.

Further, the shape, etc. of the movable yoke can optionally be selected and known displacing means such as the constitution for rack-pinion, hydraulic pressure piston or slide mechanisms can be employed.

In addition to the constitution shown in the example in which a plurality of yokes of different diameters are arranged in parallel the movable yokes can properly be arranged to the stationary yokes, for example, a constitution of arranging a plurality of movable yokes of an identical diameter in parallel or arranging a plurality of movable yokes of small diameter around a movable yoke of larger diameter, etc.

Figure 8:
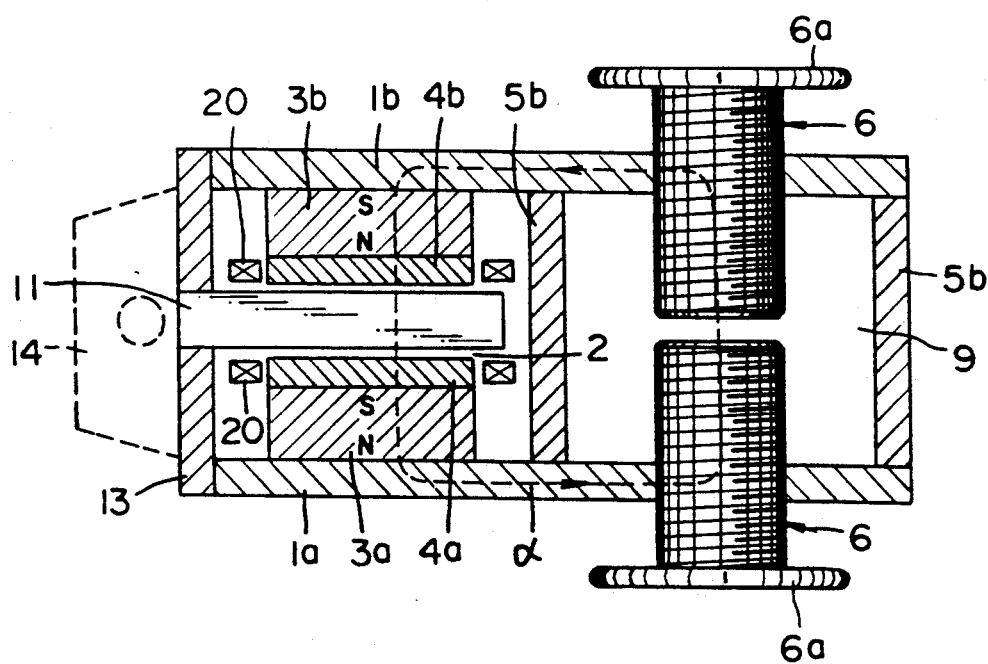
Figure 9:
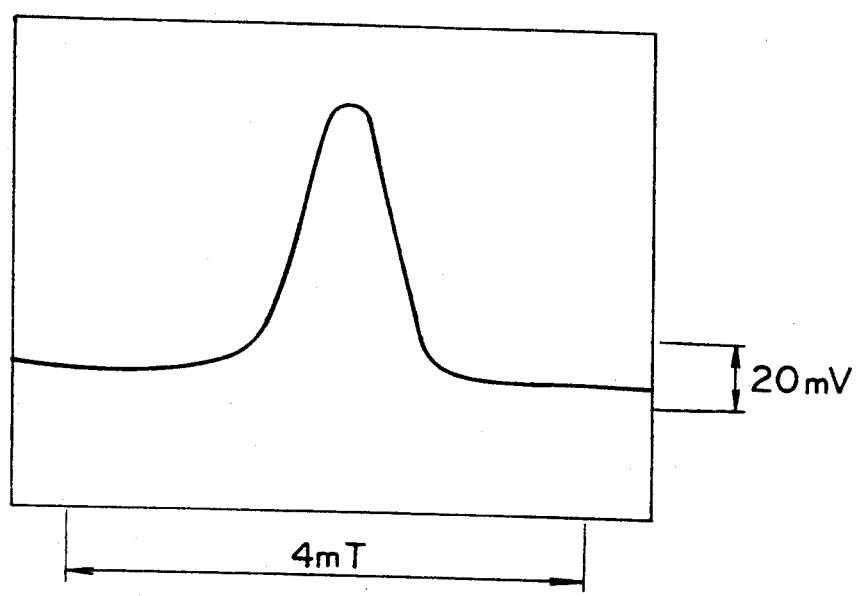
FIG. 9 is a graph illustrating an image of an oscilloscope in the ESR device according to the present invention.

As shown in FIG. 8, a pair of movable yokes are used such that the pair of the movable yokes are bought closer to or aparted from each other in symmetry with the central transverse plane of the gap.

In the present invention, the microwave generator and the microwave detector are, desirably, integrated into a module as shown in the example and they can be attached directly to a cavity resonator.

In the present invention, a modulating magnetic field application coil for supplying an AC current for applying a modulating magnetic field and/or a sweep magnetic field application coil for supplying a DC current for sweeping the magnetic field in the gap are disposed within the space around the periphery of the magnetic pole piece or the permanent magnet or around the periphery of the movable yoke.

The constitution for the arrangement and the operation of each of the coils will be explained more specifically referring to FIGS. 2 through 6. In particular, in a case of disposing the coils near the prmanent magnets, it is desirable to reduce the current supplied as low as possible considering the undesired effects on the permanent magnets caused by the generation of heat of the coils (for example, reduction of the intensity or the degree of uniformity of magnetic field in the gap due to the temperature change of the permanent magnets). Provision of a known AC power source means capable of supplying an AC current to the modulating magnetic field application coil and a known display means for outputting the detected signals upon applyin the modulating magnetic field to an oscilloscope are extremely convenient since, the ESR absorption curves can be directly observed on the oscilloscope.

Further, the ESR absorption curves can be observed directly on an X-Y recorder in the same way as above by also disposing a known DC power source means capable of supplying a DC current to the sweeping magnetic field application coil and, after setting the magnetic field intensity at a level near the magnetic resonance point by adjusting the movable yoke supplying the DC current to the sweeping magnetic field application coil thereby sweeping the magnetic field in the gap.

Further, measurement at a higher accuracy is possible by the combined use of the sweeping magnetic application coil and the modulating magnetic field application coil.

That is, by the constitution of setting the magnetic field intensity at a level near the magnetic resonance point, then seeeping the magnetic field in the gap by supplying a DC current to the sweeping magnetic field application coil, and also supplying an AC current to the modulating magnetic field application coil, thereby superposing the modulating magnetic field on the sweeping magnetic field, disposing a known electric circuit for improving the sensitivity, for example, the microwave signal under the state (detected signal voltage) by means of a lock-in amplifier, and connecting the signal with a device for outputting to print on a known recorder the detected signal can be drawn and recorded on a recorder as ESR absorption curves.

With such a constitution, values for the magnetic field intesity causing magnetic resonance can be determined at a higher accuracy by applying various mathematical processing such as differentiation, secondary differentiation, integration, etc. to the ESR absorption curves, as compared with ESR absorption curves obtained with the constitution comprising only one of the modulating magnetic field application coil or the sweeping magnetic field application coil, by which the shape of the ESR absorption curves can be measured at a higher resolving power.

The present invention will be described more in details referring to the drawings.

Figure 1:
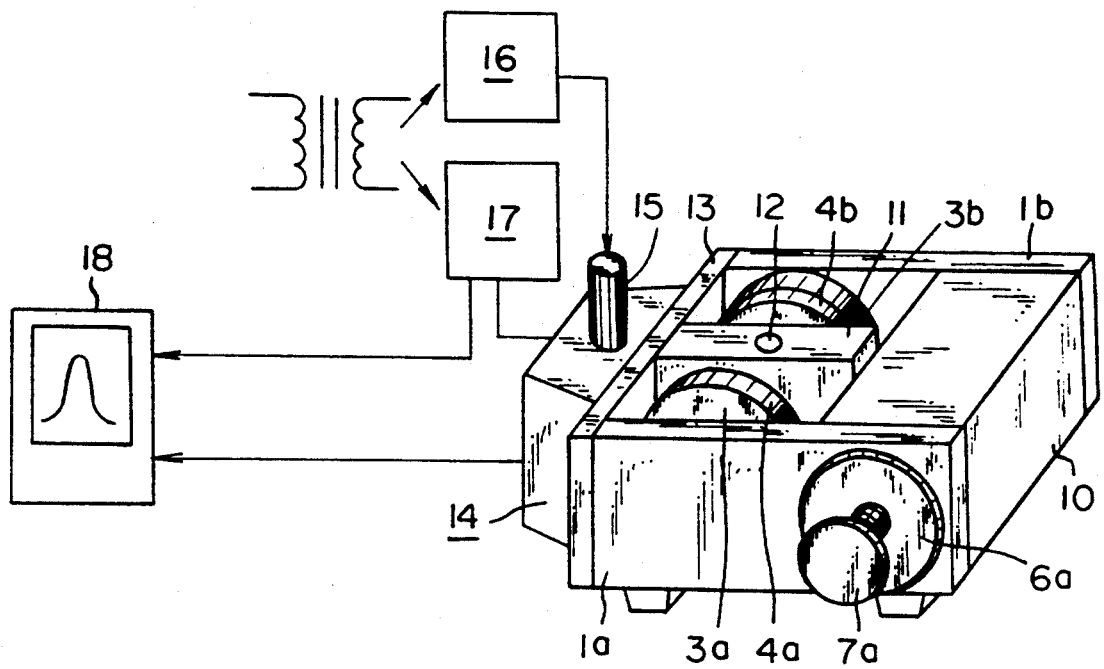
FIG. 1 is an explanatory prespective view for illustrating one embodiment of the ESR system according to the present invention.

In an ESR device and a magnetic circuit used therefor shown in FIGS. 1 and 2, a pair of plate-like stationary yokes 1a and 1b are arranged opposition to each other through yoke supports 5a and 5b made of non-magnetic material. Disc-like permanent magnets 3a and 3b attached respectively to the opposing surfaces of the plate-like stationary yokes 1a and 1b are arranged with their different magnetic poles being opposed to each other, and magnetic pole pieces 4a and 4b are fixed to the opposing surfaces of the magnets while leaving a desired gap 2 between the magnetic pole pieces 4a and 4b.

Further, a modulating magnetic field application coil 20 is wound around the periphery of the magnetic pole pieces 4a and 4b.

In FIG. 2, a coarsely movable yoke 6 of large diameter is disposed to the lower stationary yoke 1a. That is, the coarsely movable yoke 6 is made of a screwed bolt having threads formed at a required pitch to the outer circumferential surface and screw-threaded into a hole of the stationary yoke 1a.

Further, to the coarsely movable yoke 6, there is coaxially screw-threaded a finely movable yoke 7 made of a bolt member of small diameter having threads formed at a finer pitch.

When a handle 6a disposed at the top of the coarsely movable yoke 6 is rotated, the coarsely movable yoke 6 can be moved continuously in the vertical direction in the figure. In the same way, when a handle 7a of the finely movable yoke 7 is rotated, the finely movable yoke 7 can be moved continuously.

Further, to the inner surface of the upper stationary yoke 1b, there is attached a fixed yoke 8 in opposite relationship with the coarse movable yoke 6 and the finely movable yoke 7 leaving a gap 9 therebetween.

A cavity resonator 11 is disposed in the desired gap 2 between the magnetic pole pieces 4a and 4b and supported at its flange member 13 on the stationary yokes 1a and 1b, while a microwave circuit 14 comprising a microwave generator and a microwave detector integrated to each other is attached to the outer surface of the flange member 13. In the drawing, are shown a cover 10, a sample tube 12 and an oscillation frequency varying volume control.

The microwave circuit 14 is connected with a DC power source 16, an AC power source 17 and an oscilloscope 18.

With the above-described constitution shown in FIG. 2, there is formed a magnetic path shown by the broken line (a) in the magnetic field generating circuit and, when the coarsely movable yoke 6 is moved forward and backward by screwing, the opposing distance between the coarse movable yoke 6 and the fixed yoke 8, that is, the gap 9 can change continuously so that the intensity of the magnetic field formed in the gap 2 with the magnetic pole pieces 4a and 4b can be varied continuously.

That is, when the distance between the coarsely movable yoke 6 and the stationary yoke 8 is made larger, the intensity of the magnetic field in the gap 2 becomes weak and, on the contrary, if the opposing distance is made smaller, the intensity of the magnetic field in the gap 2 becomes greater.

By setting a required opposing distance between the coarse movable yoke 6 and the fixed yoke 8 and the moving the finely movable yoke 7 of a finer screw pitch forward and backward, the opposing distance with respect to the stationary yoke 8 can properly be selected to finely increase or decrease the intensity of the magnetic field in the gap 2.

When the two kinds of the movable yokes are rotated, the magnetic field intensity can be increased or decreased by a fine amount to obtain a required ESR absorption. In addition, the change of the magnetic field can be recognized quantitatively depending on the number of rotation, and the modulating magnetic field is applied by supplying an AC current by disposing the modulating magnetic field application coil around the periphery of the magnetic pole pieces 4a and 4b, by which the ESR signal can be observed directly on the oscilloscope 18.

In the foregoing explanation, the coil 20 disposed around the periphery of the magnetic pole pieces 4a and 4b are described as the modulating magnetic field application coil for applying the modulating magnetic field by supplying an AC current. However, it is also possible to further provide the coil 20 with a DC current power source and supply a DC current to sweep the magnetic field in the gap 2 thereby observing the ESR signal directly on the X-Y recorder (not shown) in the same way.

Figure 3:
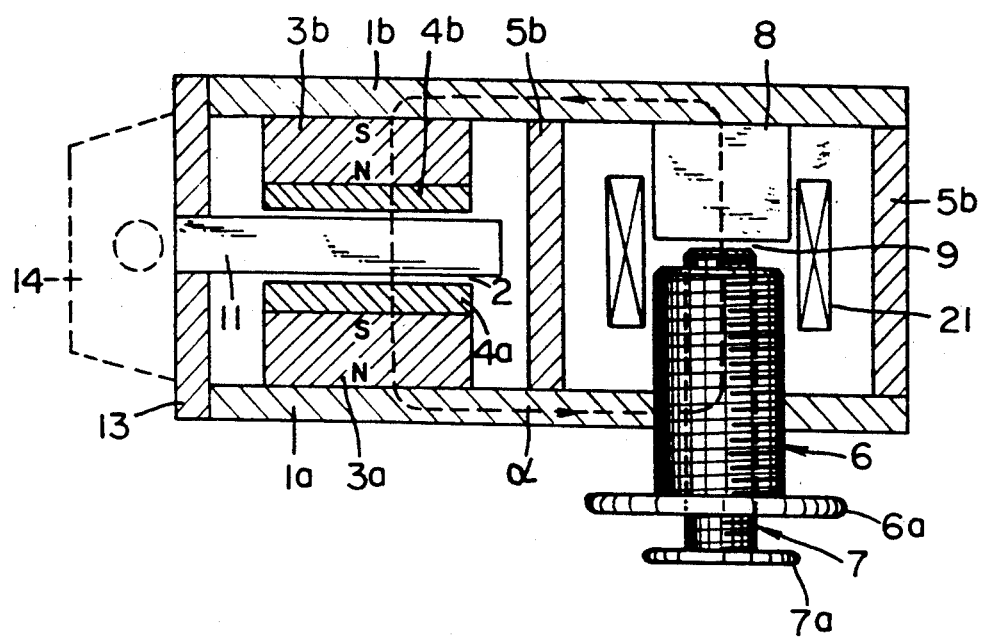
FIGS. 3 through 8 are explanatory vertical cross sectional views for illustrating other embodiments of magnetic circuits used in the ESR system shown in FIG. 1.

The magnetic circuit shown in FIG. 3 is constituted such that a sweeping magnetic field application coil 21 is disposed around the outer circumference of the coarsely movable yoke 6 without disposing the modulating magnetic field application coil around the periphery of the magnetic pole pieces 4a and 4b.

A DC power source means is disposed to the sweeping magnetic field application coil 21 and a DC current is supplied to the coil, so that the magnetic field in the gap 2 can be swept. It is also possible to dispose an AC power source means to the coil 21 and supply an AC current to the coil, so that a modulating magnetic field is applied in the gap 2.

Figure 4:
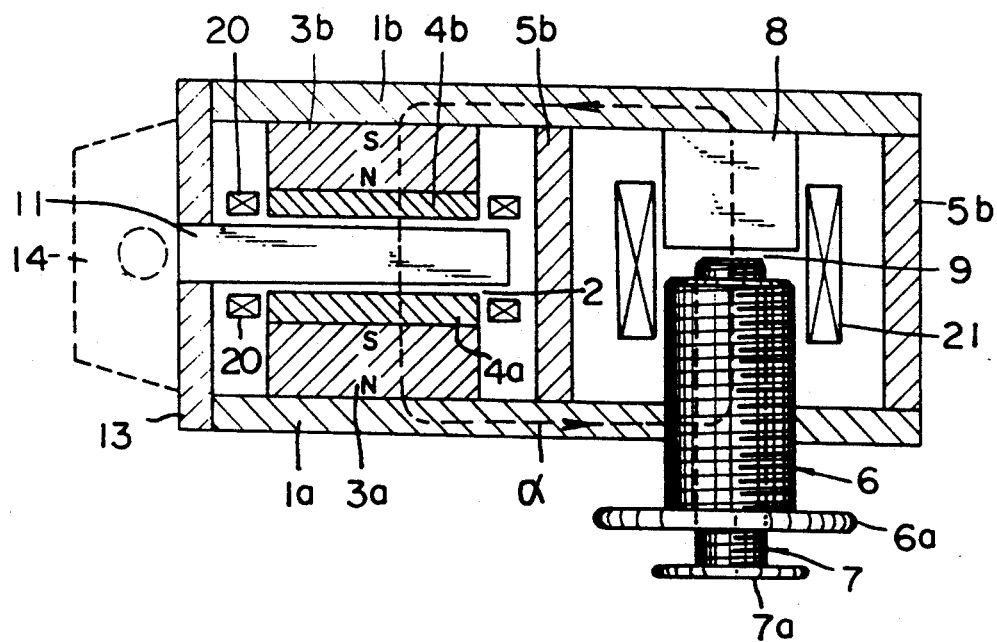

In a magnetic circuit shown in FIG. 4 each of the modulating magnetic field application coil 20 and a sweeping magnetic field application coil 21 shown in FIGS. 2 and 3 respectively are disposed in combination.

By supplying a DC current to the sweeping magnetic field application coil 21 to sweep the magnetic field and supplying an AC current to the modulating magnetic field application coil 20 to superpose the magnetic fields to each other, stepping up the detected signal voltage upon measurement by means of a lock-in amplifier (not illustrated) and inputting it into the recorder, the detected signal can be drawn and recorded as an ESR absorption curve.

Figure 5:
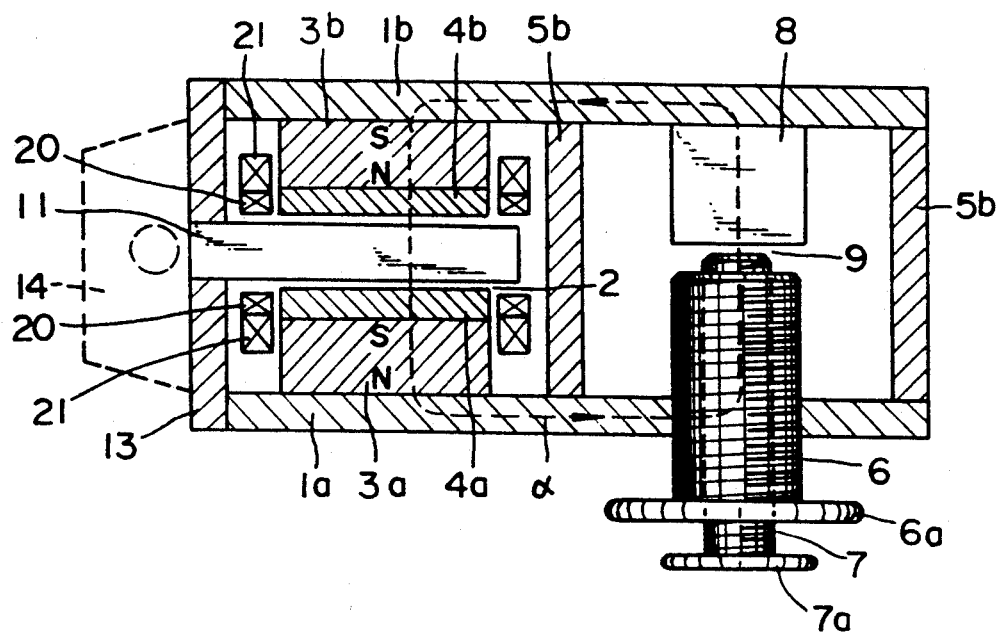
Figure 6:
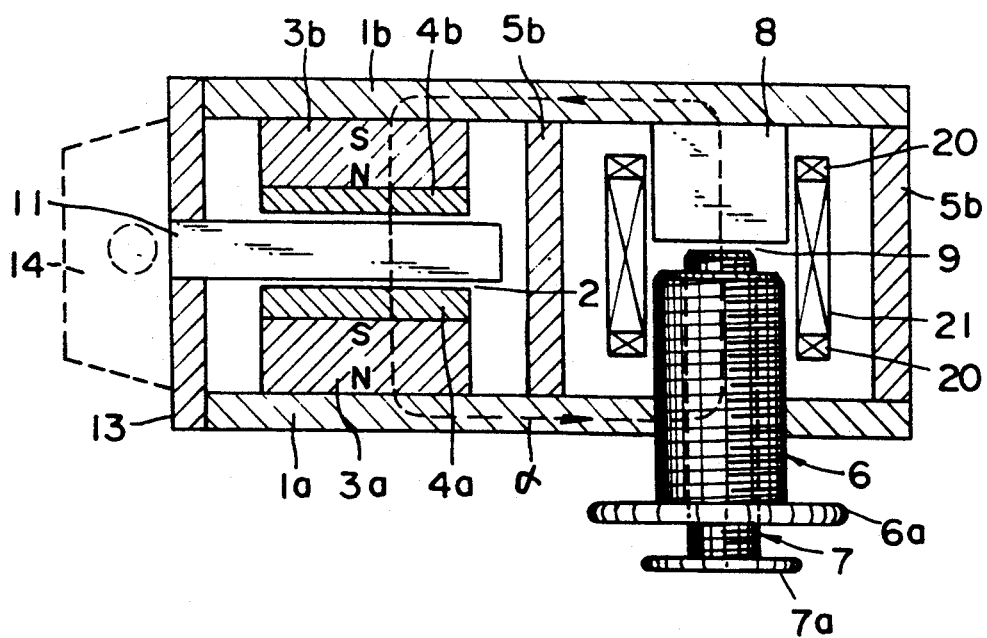

In magnetic circuits shown in FIGS. 5 and 6, the modulating magnetic field application coil 20 and the sweeping magnetic field application coil 21 are disposed in adjacent with each other. In FIG. 5, the coils 20 and 21 are disposed around the magnetic pole pieces 4a and 4b and the permanent magnets 3a and 3b. In FIG. 6, both of the coils 20 and 21 are disposed around the periphery of the coarsely movable yoke 6, by which a similar effect to that in the magnetic circuit shown in FIG. 6 can be obtained.

Magnetic circuits shown in FIGS. 7 and 8 are based on the magnetic circuit shown in FIG. 2, in which the movable yoke comprises only one screwed member 6' (FIG. 7) and a pair of movable yokes 6' and 6' are disposed respectively to a pair of stationary yokes 1a and 1b (FIG. 8), both of which can attain the purpose of the present invention and ESR absorption curves can be observed in the same way as in the case of using the magnetic circuit shown in FIG. 2.

EXAMPLE

EXAMPLE 1

When a magnetic circuit shown in FIG. 2 was used by using a Fe-B-Nd series magnet with BH(max) at 35 MGOe as the permanent magnet and arranging a coarsely movable screwed bolt of 20 mm$\phi$ and finely movable screwed bolt of 7 mm$\phi$ coaxially as a movalbe yoke to a plate-like stationary yoke, and directly coupling a microwave Doppler sensor using Gunn diode comprising a microwave oscillation source and a detector combination with a $TE_{102}$ mode rectangular cavity resonator in series, to assembly an ESR system shown in the figure of FIG. 1, an ESR device sized 70 (height)$\times$160 (width)$\times$120 (depth) (mm) and 1.6 kg of weight could be obtained, which was so microminiaturized beyond compare with those conventional ESR system using electromagnets.

The magnetic field in the space could be changed continuously while maintaining the magnetic field in the gap at a high accuracy of less than $\pm 1G$ by one rotation of the finely movable screwed bolt, by which the change of the magnetic field could be determined at an accuracy of 0.1G unit relative to the width of the signal absorption line at about 1G upon ESR measurement.

Figure 10:
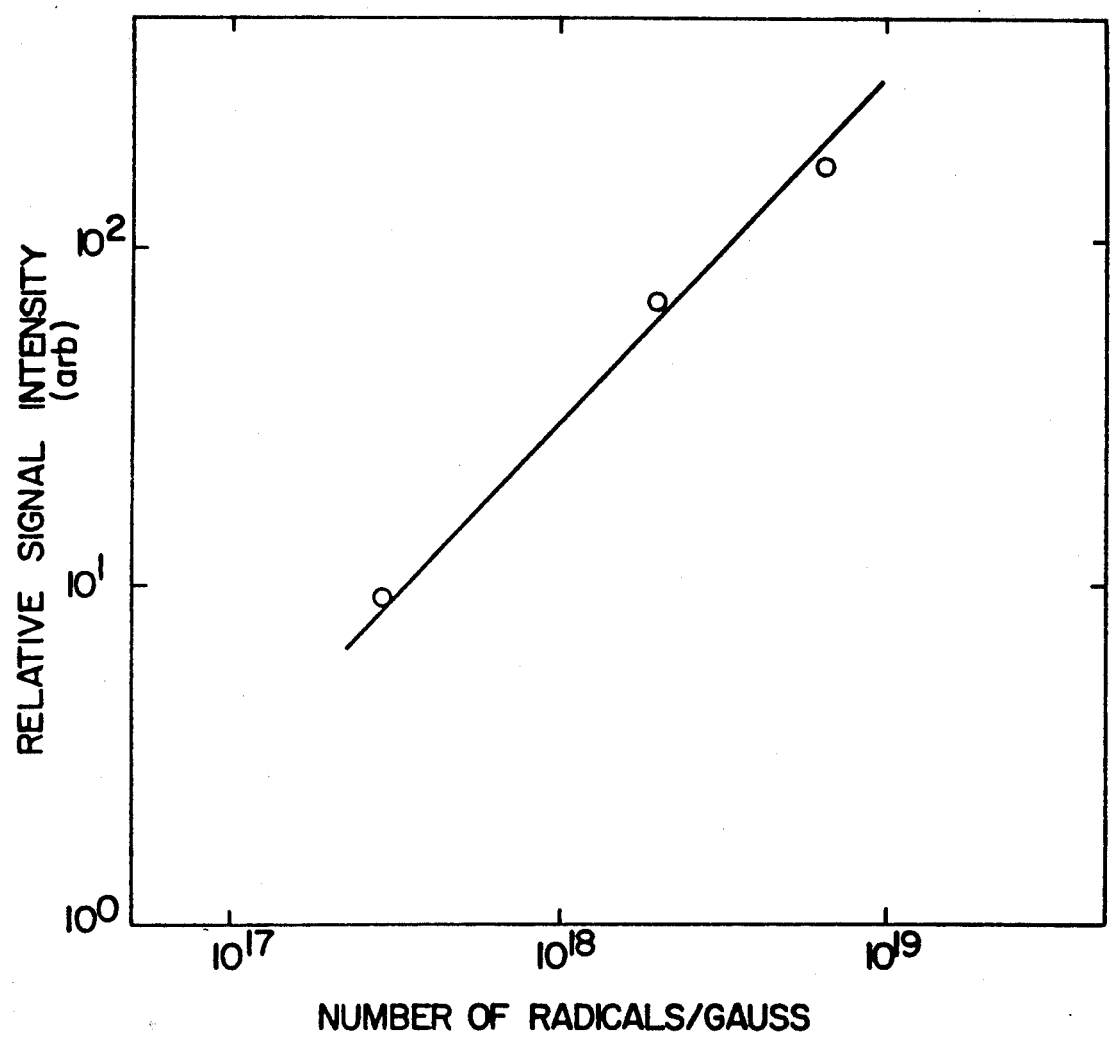
FIG. 10 is a graph illustrating the result of measurement for DPPH (diphenyl picryl hydrazyl) powder using the ESR system according to the present invention.
Figure 11:
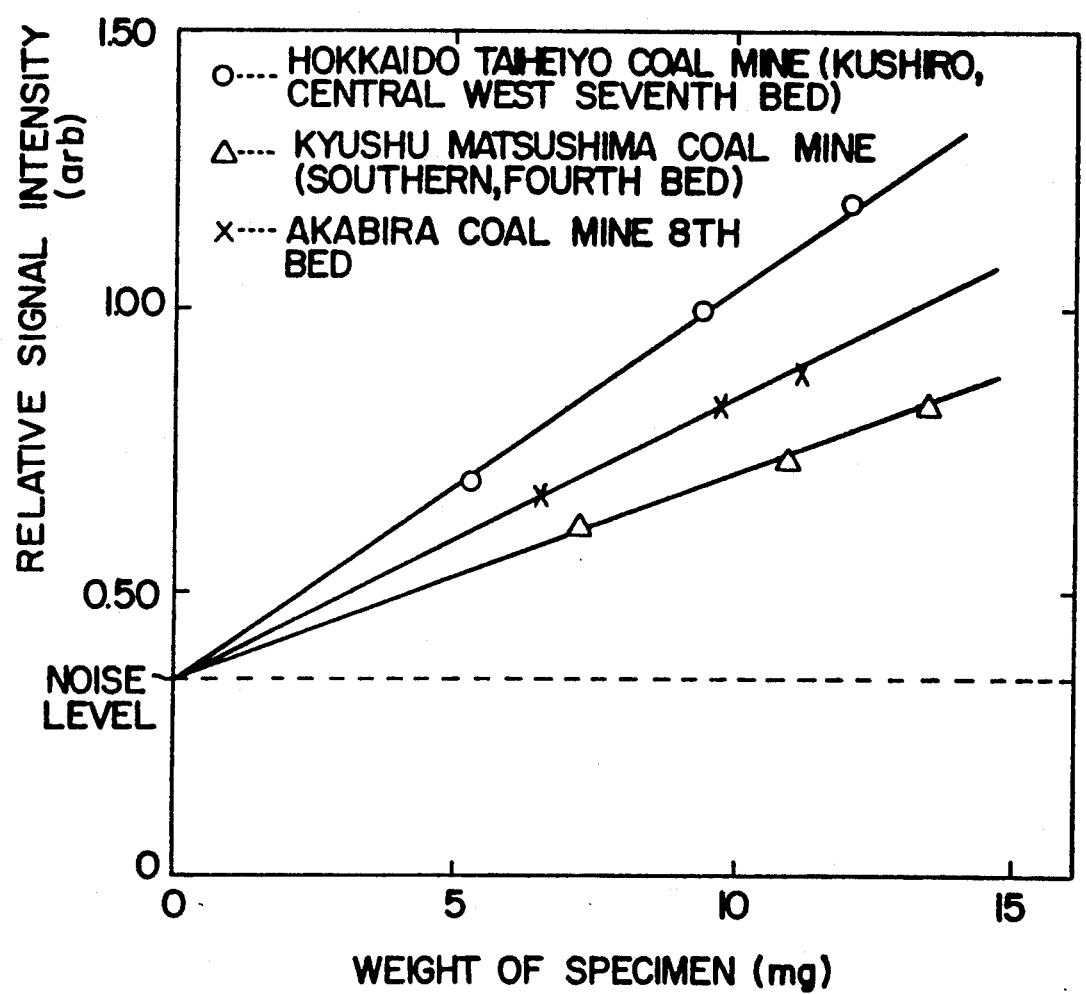
FIG. 11 is a graph illustrating the result of measurement for bituminous coal powder using the ESR system according to the present invention.

For instance, when setting Bg=375.6 mT and superposing a 60 cycle modulating magnetic field at 2 mT, an ESR absorption curve as shown in FIG. 10 could be drawn on the oscilloscope.

EXAMPLE 2

Using the ESR system according to the present invention shown in Example 1, ESR absorption curve was observed for DPPH (1.1-diphenyl-2-picryl-hydrazyl) powder on each weight while varyings weight. As a result, it could be confirmed that the relative signal intensity obtained from the ESR absorption curve was in proportion to the number of radicals of the DPPH powder as shown in FIG. 10.

In the measurement, after previously setting the magnetic field in the gap previously to Bg=375 mT, a 60 cycle modulating magnetic field at 3 mT was superposed to drawn an ESR absorption curve on the oscilloscope.

EXAMPLE 3

Using the ESR system according to the present invention shown in Example 1, ESR absorption curves were observed for bituminous coal powders sampled from respective district on each weight while varying the weight of the samples. As a result, it could be confirmed that the relationship between the relative signal intensity and the weight obtained from the ESR absorption curves was diffetent depending on the places of productions.

That is, it could be found that spin concentration varied depending on the places of production for the bituminous coal powder and on the depth of coal beds for sampling.

In the measuring, the magnetic field in the gap was set as Bg=373 to 375 mT depending on each of the specimens and, thereafter, a 60 cycle modulating magnetic field at 3 mT was superposed to draw the ESR absorption curves on the oscilloscope.

As apparent from the examples, since the ESR system according to the present invention has an entire weight of not greater than 2 kg, and a volume of as small as possible, it has an advantage that it can be carried by one hard to a measuring site compared with conventional ESR systems which are not portable.

Further, since a permanent magnet circuit is used, a large power source for generating a stationary magnetic field in the gap of the magnetic circuit and a water cooling device are no more necessary and, since the microwave circuit is also simplified as compared with the conventional system by effectively disposing a microwave Doppler sensor using Gunn diode, the number of parts is remarkably reduced and the manufacturing and maintenance are easy. In addition, while the conventional ESR system is expensive, the present system can be provided at a greatly reduced cost. Further, the system is usable also as radiation dosimeter or like other ESR application instruments.

Furthermore, since a movable yoke is used for the permanent magnet magnetic circuit, the magnetic field in the cavity resonator can be varied continuously at an accuracy of 0.1 G unit while maintaining a high accuracy of not greater than $\pm 1G$.

What is claimed is:
1. An electron spin resonance system, comprising:
a magnetic circuit in which each permanent magnet, including a magnetic pole piece on the surface thereof, of a pair of permanent magnets is respectively attached to an opposing surface of a stationary yoke of a pair of stationary yokes mounted opposite to each other to form a gap, a movable yoke mounted for continuously changing the distance between opposing surfaces of the stationary yokes, so that the magnetic resistance of a magnetic path formed by said permanent magnets, stationary yokes and movable yokes is continuously modulated, thereby forming a continuously modulated magnetic field in the gap between the opposed permanent magnets;

coils for applying a modulating magnetic field to said gap and a sweeping magnetic field application coil for applying a sweeping magnetic field to said gap;

a cavity resonator disposed in said gap for receiving specimens to be measured; and a microwave generator and a microwave detector attached to the outside of said cavity resonator.

2. An electron spin resonance system as defined in claim 1, wherein the modulating magnetic field application coil are disposed around the periphery of the magnetic pole piece or the permanent magnet.

3. An electron spin resonance system as defined in claim 1, wherein the modulating magnetic field application coils are disposed around the periphery of the movable yoke.

4. An electron spin resonance system as defined in claim 1, wherein the sweeping magnetic field application coils are disposed around the periphery of the magnetic pole piece or the permanent magnet.

5. An electron spin resonance system as defined in claim 1, wherein the sweeping magnetic field application coils are disposed around the periphery of the movable yoke.

6. An electron spin resonance system as defined in claim 2, further comprising an AC power source means capable of supplying an AC current to the modulating magnetic field application coil and a display means for outputting the microwave detected signal upon application of the modulating magnetic field is outputted to an oscilloscope.

7. An electron spin resonance system as defined in claim 5, further comprising a DC power source means capable of supplying a DC current to the sweeping magnetic field application coil and a display means capable of outputting a microwave detected signal upon application of the sweeping magnetic field to the x-y recorder.

8. An electron spin resonance system as defined in claim 2, further comprising a lock-in amplifier for improving the sensitivity by stepping up the detected signal voltage.

9. An electron spin resonance system as defined in claim 1, wherein a microwave circuit comprises a microwave generator and a microwave detector integrated into a module.

10. An electron spin resonance system as defined in claim 9, wherein a microwave Doppler sensor using a Gunn diode is the microwave circuit.

11. An electron spin resonance system as defined in claim 1, wherein the cavity resonator is a $TE_{102}$ mode rectangular cavity resonator.

12. An electron spin resonance system as defined in claim 1, wherein the permanent magnet comprises an Fe-B-R series permanent magnet.

13. An electron spin resonance system as defined in claim 1, wherein the movable yoke comprises a bolt member forwarded and backwarded by a screw coupling passing through the stationary yoke.

14. An electron spin resonance system as defined in claim 13, wherein the bolt member comprises a plurality of bolt members disposed coaxially.

15. An electron spin resonance system as defined in claim 14, wherein the bolt member comprises a coarsely movable screwed bolt of a greater diameter and a fine movable screwed bolt of a smaller diameter.

16. An electron spin resonance system as defined in claim 1, wherein the movable yoke is disposed at one of the pair of yokes and the stationary yoke is disposed at another of the pair of yokes.

17. An electron spin resonance system as defined in claim 1, wherein the movable yoke is disposed at each one of the pair of yokes.

18. An electron spin resonance system as defined in claim 3, wherein an AC power source means capable of supplying an AC current to the modulating magnetic field application coil and a display means for outputting the microwave detected signal upon application of the modulating magnetic field is outputted to an oscilloscope.

19. An electron spin resonance system as defined in claim 4, wherein a DC power source means capable of supplying a DC current to the sweeping magnetic field application coil and a display means capable of outputting a microwave detected signal upon application of the sweeping magnetic field to the X-Y recorder are disposed.

20. An electron spin resonance system, comprising:

a magnetic circuit in which each permanent magnet, including a magnetic pole piece on the surface thereof, of a pair of permanent magnets is respectively attached to an opposing surface of a stationary yoke of a pair of stationary yokes are mounted opposite to each other to form a gap, a movable yoke mounted for continuously changing the distance between opposing surfaces of the stationary yokes, so that the magnetic resistance of a magnetic path formed by said permanent magnets, stationary yokes and movable yokes is continuously modulated, thereby forming a continuously modulated magnetic field in the gap between the opposed permanent magnets;

coils for applying a modulating magnetic field to said gap or a sweeping magnetic field application coil for applying a sweeping magnetic field to said gap;

a cavity resonator disposed in said gap for receiving specimens to be measured; and a microwave generator and a microwave detector attached to the outside of said cavity resonator.

21. An electron spin resonance system as defined in claim 20, wherein the modulating magnetic field application coil is disposed around the periphery of the magnetic pole piece or the permanent magnet.

22. An electron spin resonance system as defined in claim 20, wherein the modulating magnetic field application coil is disposed around the periphery of the movable yoke.

23. An electron spin resonance system as defined in claim 20, wherein the sweeping magnetic field application coils are disposed around the periphery of the magnetic pole piece or the permanent magnet.

24. An electron spin resonance system as defined in claim 20, wherein the sweeping magnetic field application coils are disposed around the periphery of the movable yoke.

25. An electron spin resonance system as defined in claim 21, wherein an AC power source means capable of supplying an AC current to the modulating magnetic field application coil is disposed and a display means for outputting the microwave detected signal upon application of the modulating magnetic field is outputted to an oscilloscope.

26. An electron spin resonance system as defined in claim 25, further comprising a DC power source means capable of supplying a DC current to the sweeping magnetic field application coil and a display means capable of outputting a microwave detected signal upon application of the sweeping magnetic field to the x-y recorder.

27. An electron spin resonance system as defined in claim 20, wherein a microwave circuit comprises a microwave generator and a microwave detector integrated into a module.

28. An electron spin resonance system as defined in claim 27, wherein a microwave Doppler sensor using a Gunn diode is the microwave circuit.

29. An electron spin resonance system as defined in claim 20, wherein the cavity resonator is a $TE_{102}$ mode rectangular cavity resonator.

30. An electron spin resonance system as defined in claim 20, wherein the permanent magnet comprises an Fe-B-R series permanent magnet.

31. An electron spin resonance system as defined in claim 20, wherein the movable yoke comprises a bolt member forwarded and backwarded by a screw coupling passing through the stationary yoke.

32. An electron spin resonance system as defined in claim 31, wherein the bolt member comprises a plurality of bolt members disposed coaxially.

33. An electron spin resonance system as defined in claim 32, wherein the bolt member comprises a coarsely movable screwed bolt of a greater diameter and a fine movable screwed bolt of a smaller diameter.

34. An electron spin resonance system as defined in claim 20, wherein the movable yoke is disposed at one of the pair of yokes and the stationary yoke is disposed at another of the pair of yokes.

35. An electron spin resonance system as defined in claim 20, wherein the movable yoke is disposed at each one of the pair of yokes.

36. An electron spin resonance system as defined in claim 22, wherein an AC power source means capable of supplying an AC current to the modulating magnetic field application coil and a display means for outputting the microwave detected signal upon application of the modulating magnetic field is outputted to an oscilloscope.

37. An electron spin resonance system as defined in claim 23, wherein a DC power source means capable of supplying a DC current to the sweeping magnetic field application coil and a display means capable of outputting a microwave detected signal upon application of the sweeping magnetic field to the X-Y recorder are disposed.

* * * * *

UNITED STATES PATENT AND TRADEMARK OFFICE
CERTIFICATE OF CORRECTION

PATENT NO. : 5,204,628
DATED : April 20, 1993
INVENTOR(S) : Konta, Konishi; Akio Nakanishi; and Nohoko Sugahara It is certified that error appears in the above-indentified patent and that said Letters Patent is hereby corrected as shown below:

In Claim 26 at column 11, line 7, delete "25" and insert --24--.

Signed and Sealed this

Sixth Day of September, 1994

Attest:

BRUCE LEHMAN

*Attesting Officer*      *Commissioner of Patents and Trademarks*